United States Patent [19]
Polinsky

[11] 4,136,353
[45] Jan. 23, 1979

[54] BIPOLAR TRANSISTOR WITH HIGH-LOW EMITTER IMPURITY CONCENTRATION

[75] Inventor: Murray A. Polinsky, Somerville, N.J.

[73] Assignee: RCA Corporation, New York, N.Y.

[21] Appl. No.: 799,722

[22] Filed: May 23, 1977

Related U.S. Application Data

[63] Continuation-in-part of Ser. No. 591,955, Jun. 30, 1975, abandoned.

[51] Int. Cl.² ............................................. H01L 29/72
[52] U.S. Cl. ...................................... 357/34; 357/40; 357/89; 357/90
[58] Field of Search ...................... 357/34, 90, 13, 40, 357/48, 89

[56] References Cited

U.S. PATENT DOCUMENTS

| | | | |
|---|---|---|---|
| 3,943,554 | 3/1976 | Russell et al. | 357/40 |
| 4,039,857 | 8/1947 | Ahmed | 357/40 |
| 4,049,478 | 9/1977 | Ghosh et al. | 357/89 |

FOREIGN PATENT DOCUMENTS

| | | | |
|---|---|---|---|
| 2251916 | 6/1975 | France | 357/34 |
| 1355806 | 6/1974 | United Kingdom | 357/34 |
| 1460037 | 12/1976 | United Kingdom | 357/34 |

OTHER PUBLICATIONS

H. Yagi et al., "A Novel and High Performance Bipolar Device of Low Emitter Impurity Concentration Structure," J. Japan Soc. App. Phys., vol. 44, 1975, pp. 279-283.

V. Hinrichs, "Die Planartechnik bei Transistoren und Integrierten Schaltungen," Scientia Electrica, vol. X, #4, 1964, pp. 97-122.

M. Joshi et al., "Phosphorous Emitter Diffusion, "IBM Tech. Discl. Bull., vol. 13, #5, Oct. 1970, pp. 1066, 1067.

*Primary Examiner*—Joseph E. Clawson, Jr.
*Attorney, Agent, or Firm*—H. Christoffersen; T. H. Magee

[57] ABSTRACT

An improved bipolar transistor including an emitter region having a relatively high-impurity-concentration portion separated from the base region of the transistor by a significantly lower-impurity-concentration portion disposed therebetween comprises a graded impurity concentration in the low-impurity-concentration portion with the lowest-impurity-concentration section thereof being disposed adjacent the base region.

8 Claims, 14 Drawing Figures

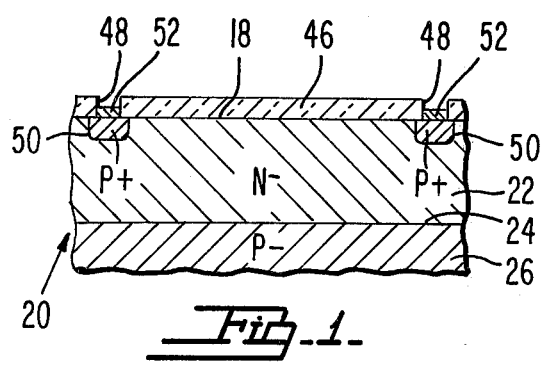
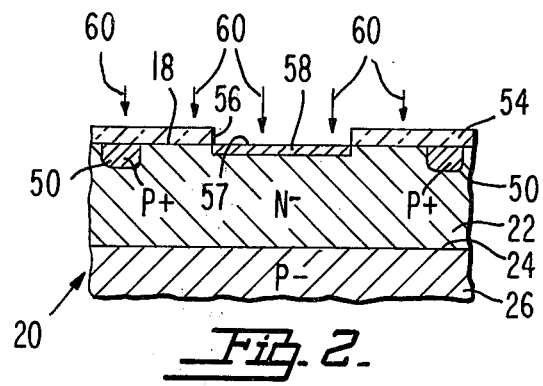
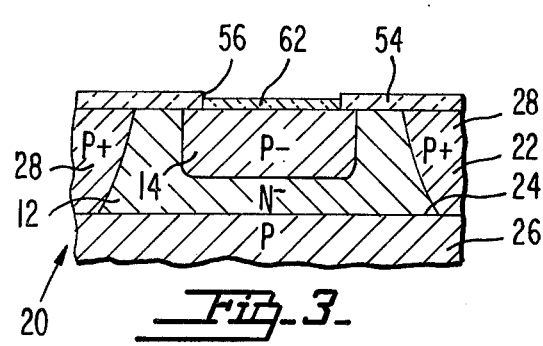
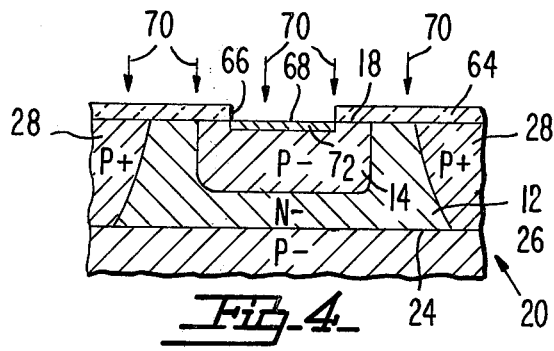
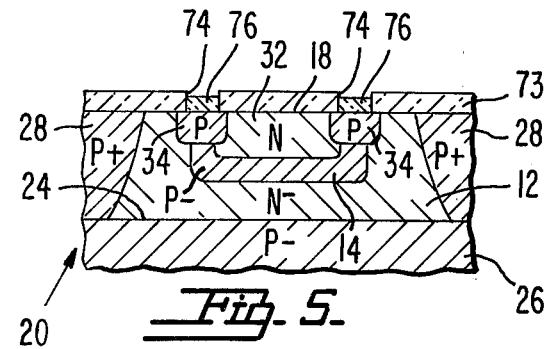
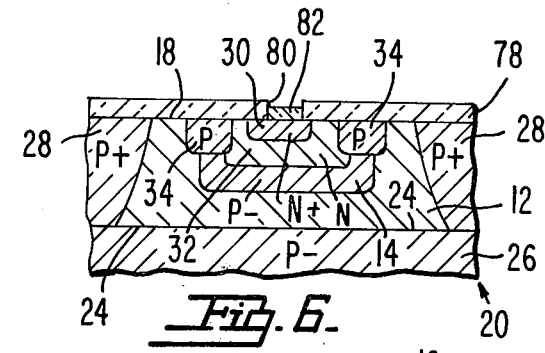
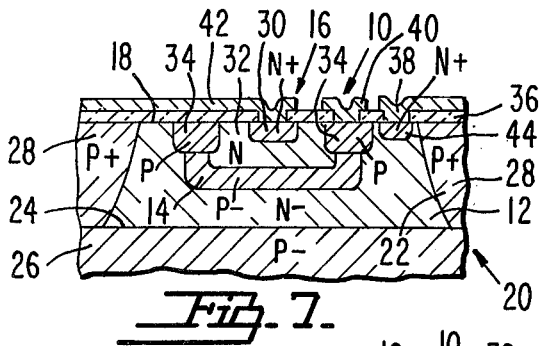
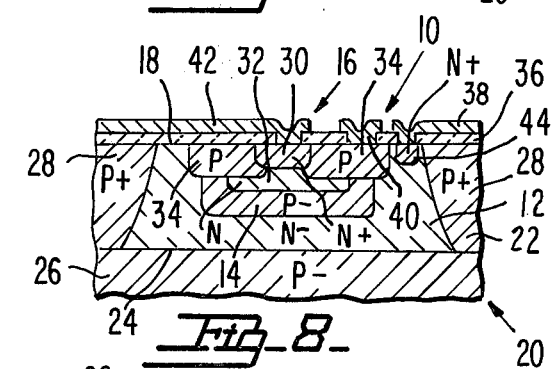
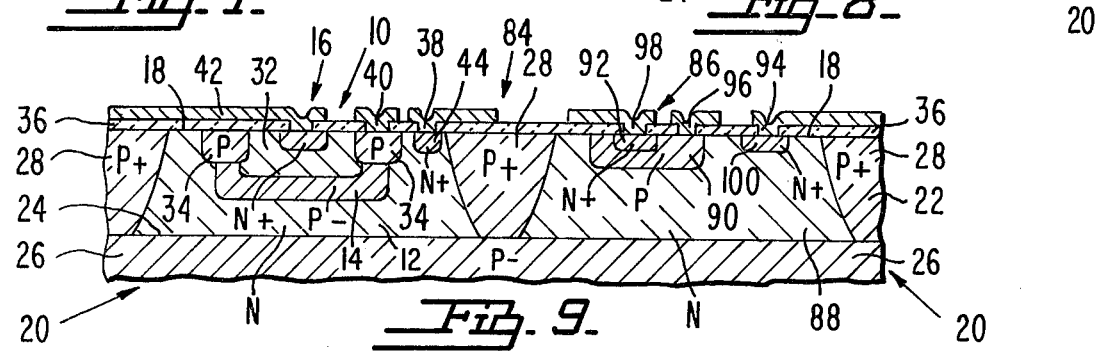

BIPOLAR TRANSISTOR WITH HIGH-LOW EMITTER IMPURITY CONCENTRATION

This application is a continuation-in-part of U.S. Ser. No. 591,955, filed June 30, 1975 now abandoned.

This invention relates to a bipolar transistor having an emitter region comprising a relatively high-impurity-concentration portion separated from the base region of the transistor by a significantly lower-impurity-concentration portion disposed therebetween.

Bipolar transistor structures are known wherein the emitter region of a transistor comprises a relatively high-impurity-concentration portion separated from the base region of the transistor by a significantly lower impurity-concentration portion disposed therebetween. Such a transistor may be descriptively called a high-low emitter concentration transistor. U.S. Pat. No. 3,591,430, issued to E. S. Schlegel, illustrates the high-low emitter structure and describes a method for its fabrication. See also, for example, H. Yagi and T. Tsuyuki, "A Novel and High Performance Bipolar Device of Low Emitter Impurity Concentration Structure", *Digest of Technical Papers, The 6th Conference on Solid State Devices*, Sept. 2-3, 1974, Tokyo, Japan, pages 31-32; and "Sony Starts Coverting Bipolar Devices to New Structure for Higher Performance", *Electronics*, June 27, 1974, page 56.

The high-low emitter structure comprises either an N+N or P+P type conductivity configuration for the emitter region. The N+N or P+P configuration creates a built-in electric field at the N+N or P+P junction which operates as an electrical barrier to reflect the minority carriers from the base region away from the PN junction and thereby keep the value of the injected minority carrier current from the base region to a minimum. This built-in electric field is ohmic to the majority carriers. As a result of this high-low configuration, the majority carrier current may be large compared to the minority carrier current, and consequently a high emitter efficiency for such a transistor can be obtained. In addition, the high-impurity-concentration portion of the emitter region, which may be affected by crystal defects originated by anomalous diffusion effects inherent in the formation of such a highly-doped region, is spaced away from the base region, resulting in improved yields and more perfect emitter-base junctions. The present invention provides an improved high-low emitter structure and method for its fabrication which further improves the emitter efficiency of such a transistor.

In the drawings:

FIGS. 1 to 7 are a series of cross-sectional views showing a succession of steps in the manufacture of one embodiment of the present improved transistor.

FIG. 8 is a cross-sectional view showing a second embodiment of the present improved transistor.

FIG. 9 is a cross-sectional view showing a monolithic integrated circuit device having the present improved transistor as an element thereof.

Figure 10A:
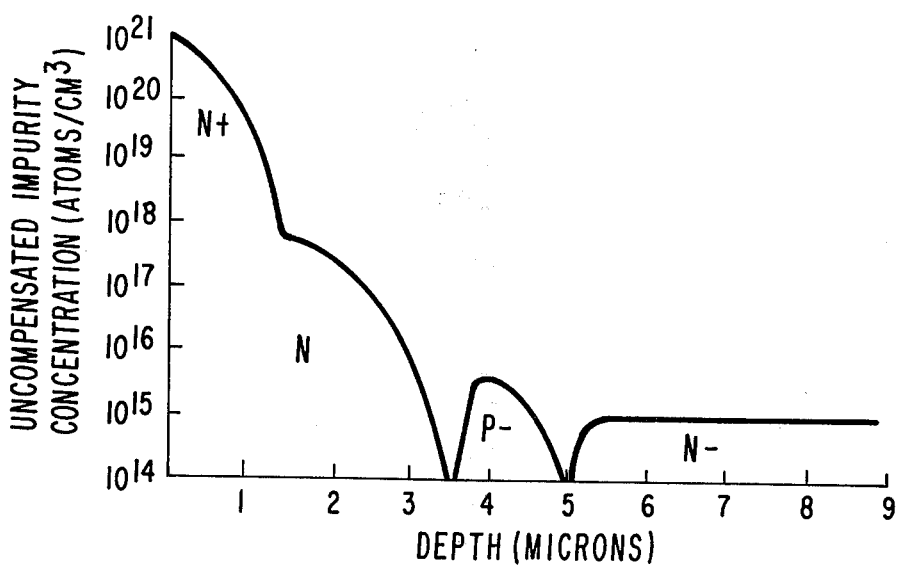
FIGS. 10a through 10e are a series of impurity-concentration profiles illustrating typical depth distributions of conductivity modifiers taken at various locations along the cross-sectional view shown in FIG. 9.
Figure 10B:
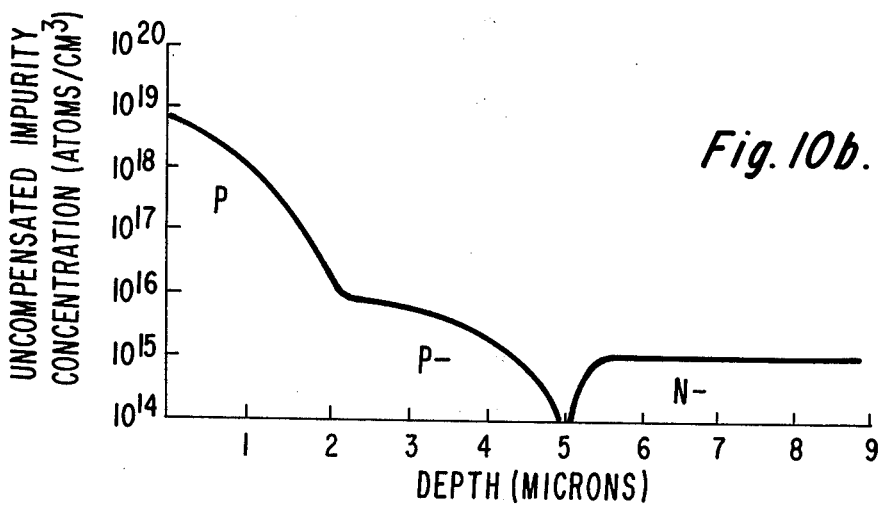
Figure 10C:
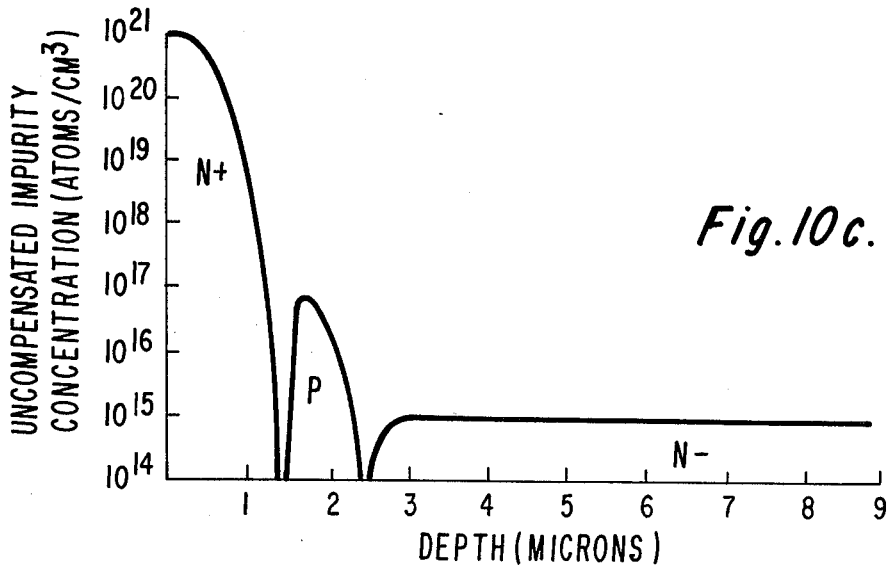
Figure 10D:
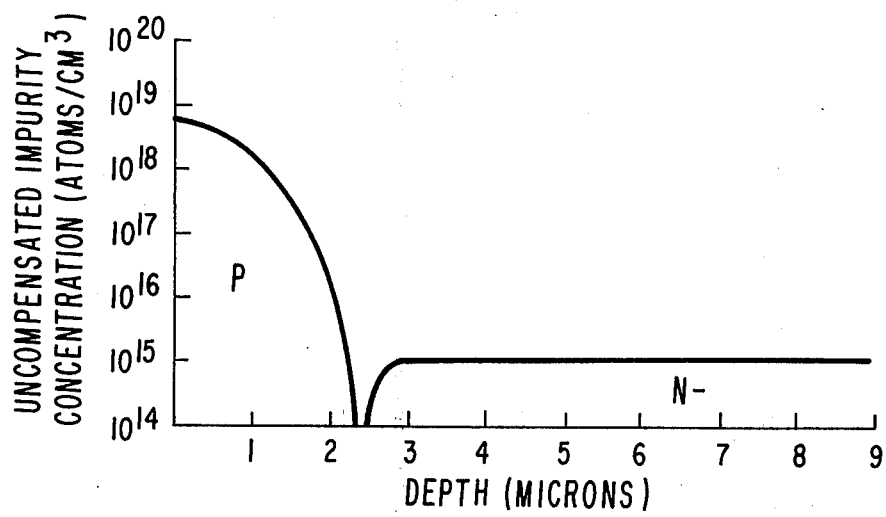
Figure 10E:
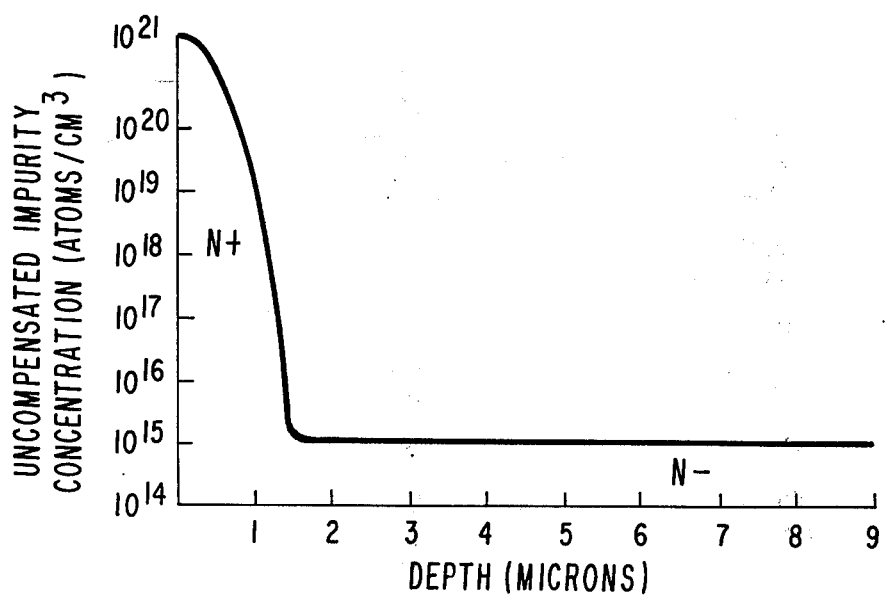

Referring to FIG. 7 of the drawings, there is shown one embodiment of the present high-low emitter concentration transistor 10. The transistor 10 includes a collector region 12 of one type conductivity, N-type in the present example, a base region 14 of the opposite type conductivity disposed adjacent to the collector region 12, and an emitter region 16 of the one type conductivity disposed adjacent the base region 14 away from the collector region 12. The transistor 10 may be a vertical planar transistor having the collector, base and emitter regions 12, 14 and 16 adjacent to a common surface 18 thereof, and wherein the collector region 14 is a junction-isolated region disposed in a body 20 of semiconductor material of the opposite type conductivity, as shown in FIG. 7. Such a junction-isolated collector region 12 is typically part of an epitaxial layer 22 disposed on the upper boundary 24 of a substrate 26 of the opposite type conductivity. More heavily-doped isolation regions 28 extend through the epitaxial layer 22 from the surface 18 thereof to the boundary 24 of the substrate 12 to separate the layer 22 into a plurality of junction-isolated regions, including the collector region 12. Although the transistor 10 is illustrated as a junction-isolated element of an integrated circuit device, the present novel invention is not limited to this particular embodiment and may indeed comprise simply a discrete transistor.

The emitter region 16 of the transistor 10 comprises a relatively high-impurity-concentration portion 30 which is separated from the base region 14 by a significantly lower-impurity-concentration portion 32 disposed therebetween, as shown in FIG. 7. Referring to FIG. 10a, the emitter region 16 has an impurity-concentration profile containing a reentrant segment characterized by a point of inflection in the slope of the profile at the high-low junction. The two portions 30 and 32 of the emitter region 16 are separated from each other by this distinct high-low junction, as illustrated in FIG. 7. The exact depth of the high-low junction is not critical to the present invention, but such junction is characterized by a point of inflection in the impurity-concentration profile, which is the typical distinguishing feature of all high-low junctions, as known in the semiconductor art. In a typical high-low emitter region 16, the average concentration of conductivity modifiers in the high-impurity-concentration portion 30 is about $10^{19}$ atoms per cubic centimeter or greater, whereas the average concentration of conductivity modifiers in the low-impurity-concentration portion 32 is approximately $10^{15}$ atoms per cubic centimeter. Applicant's improvement in such a structure comprises a graded impurity concentration in the low-impurity-concentration portion 32 of the emitter region 16 with the lowest-impurity-concentration section thereof being disposed adjacent the base region 14. The determination of whether such low-impurity-concentration portion 32 is graded in one or two directions and whether the highest-impurity-concentration section thereof is disposed adjacent the common surface 18 or not is dependent upon the particular method used to form the low-impurity-concentration portion 32, as explained below.

If the present high-low emitter concentration transistor 10 is a vertical transistor, it is preferred that the portion 34 of the base region 14 disposed adjacent the common surface 18 and between the collector and emitter regions 12 and 16 have an impurity concentration which is higher than the remaining portion of the base region 14, as shown in FIG. 7. In FIG. 8, there is shown a second embodiment of the present novel transistor 10 wherein the higher-impurity-concentration portion 34 of the base region 14 extends through that portion of the emitter region 16 which is adjacent thereto so that it meets the high-impurity-concentration portion 30 of the emitter region 16 which overlaps the portion 34, whereby the low-impurity-concentration portion 32 of the emitter region 16 is not adjacent to the common surface 18. The advantages of such structures in combination with the present high-low emitter region 16 are explained below.

Also shown in FIGS. 7 and 8 is a protective layer 36 of insulating material such as, for example, silicon dioxide which is disposed on the surface 18 of the transistor 10 and which has appropriate openings therein permitting collector, base and emitter contact electrodes 38, 40 and 42 to electrically contact respectively the collector, base and emitter regions 12, 14 and 16 of the transistor 10. A more-heavily-doped collector contact region 44 of the one type conductivity may be provided.

The novel high-low emitter concentration transistor 10 is made by the present novel method of which some of the steps are illustrated in FIGS. 1 to 7. Many conventionally practiced steps such as, for example, cleaning and photolithographing are not illustrated and will be omitted in the description of the method. Referring to FIG. 1, a typical beginning step in the present improved method comprises providing the substrate 26, a silicon wafer of P-type conductivity in the present example, with the epitaxial layer 22 using known conventional processes. The conditions of the epitaxial growth process are adjusted in known fashion to produce material having a resistivity of about 3 to about 6 ohm-centimeters in the present example. The thickness of the layer 22 is preferably in the range of twelve to fourteen micrometers.

After the formation of the layer 22, the collector and base regions 12 and 14 are formed therein. Typically, the isolation regions 28 are first partially formed. For this purpose a masking oxide layer 46 is formed on the surface 18, preferably by heating the body 20 of semiconductor material in an oxidizing atmosphere which contains a small amount of hydrochloric acid, in order to provide a clean, thermally grown silicon dioxide layer 46. It will be understood that thermal oxidation steps of this kind consume part of the material of the semiconductor body 20 so that each oxidation produces a new boundary within the semiconductor material. For convenience in illustration, the surface of the layer 22 will be designated as the surface 18 throughout the figures. After forming openings 48 in the oxide layer 46 in the pattern desired for the isolation regions 28, a source of conductivity modifiers for the isolation regions 28, P type in this example, is provided adjacent to the surface 18, and the modifiers are thereafter partially redistributed to produce PN junctions 50 within the layer 22 at a depth less than the desired depth for the isolation regions 28. This step should be carried out in an oxidizing atmosphere, such as dry oxygen, with the result that the openings 48 in the layer 46 are closed by the oxidation of the surface 18 of the layer 22 to form additional oxide layers 52.

After removing the oxide layers 46 and 52 and producing on the surface 18 a new masking oxide coating 54 (FIG. 2) having an opening 56 therein in the pattern of the base region 14, a source of conductivity modifiers, P type in this example, is next formed adjacent to the surface 18. This source is shown in FIG. 2 as a shallow region 58 which is formed preferably by the processes of ion implantation, the details of which are generally known in the art. In the present example, the body 20 of semiconductor material is placed in a conventional ion implantation apparatus and ions of a P type conductivity modifier such as, for example, boron are accelerated toward the body 20, as suggested by the arrows 60 in FIG. 2, with an energy of about 100 KEv to provide a dose of boron amounting to about $2.4 \times 10^{13}$ atoms/cm$^2$ through the surface 18. The ions bombard the area 57 of the surface 18 exposed by the opening 56, whereby atoms of boron are implanted in the semiconductor body 20 beneath the exposed area 57. The body 20 of semiconductor material is next heated to redistribute the implanted atoms to form the base region 14 (FIG. 3). Simultaneously, the conductivity modifiers previously introduced to form the isolation regions 28 will be redistributed through the layer 22 whereby the collector region 12 is defined, also as shown in FIG. 3. This process is also carried out in an oxidizing atmosphere, thereby closing the opening 56 in the layer 54 with an oxide coating 62. A more detailed description of the above steps is contained in Polinsky, U.S. Pat. No. 3,898,107, the disclosure of which is incorporated herein by reference.

The low-impurity-concentration region 32 of the emitter region 16 is next formed by utilizing any doping process which forms a graded impurity concentration therein with the lowest-impurity-concentration section thereof being disposed adjacent the base region 14. Preferably, this step is performed in a similar manner by forming a new masking oxide coating 64 (FIG. 4) having an opening 66 therein in the pattern of the low-impurity-concentration region 32, and then bombarding the area 68 of the surface 18 exposed by the opening 66 with ions of a conductivity modifier of the one type conductivity, N type in this example, as suggested by the arrows 70 in FIG. 4, whereby atoms of the one type conductivity modifier are implanted in the semiconductor body 20 beneath the exposed area 68. The implanted atoms thereby form a shallow region 72 adjacent to the base region 14. The depth distribution of the implanted atoms in the semiconductor body 20 is approximately Gaussian in shape, with the highest-impurity-concentration section of the implanted region 72 lying beneath the surface 18. The semiconductor body 20 is now heated again to a temperature at which the implanted atoms will diffuse into the semiconductor material, and maintained at this temperature until a desired redistribution of the atoms is achieved, thereby forming the low-impurity-concentration region 32 as shown in FIG. 5. Such a drive-in diffusion more uniformly distributes the implanted atoms and, preferably, the drive-in diffusion is continued until a distribution is achieved which is graded in one direction only with the highest-impurity-concentration section of the region 32 adjacent the surface 18.

Where the transistor is a vertical transistor 10 and the higher-impurity-concentration portion 34 is desired for the base region 14, the present method further comprises forming a new masking oxide coating 73 (FIG. 5) having a ring-shaped opening 74 therein in the pattern of the higher-impurity-concentration region 34, and then performing a conventional deposition process to provide a source of conductivity modifiers, P type in this example, adjacent to the surface 18. The conductivity modifiers are next redistributed to produce the higher-impurity-concentration portion 34 as shown in FIGS. 5, 7 and 8. Such portion 34 may be diffused simultaneously with the drive-in diffusion of the low-impurity-concentration region 32. During this process, the opening 74 is closed with an oxide coating 76. It will be understood by those of ordinary skill that some further diffusion of the base region 14, the isolation regions 28 and the region 32 will take place during further processing, so that in the design of the present method the diffusion times should accordingly be proportionately less than the total time required to form these regions.

The high-impurity-concentration region 30 of the emitter region 16 is next formed in a manner similar to the formation of the region 34. A new masking oxide layer 78 (FIG. 6), having an opening 80 therein in the pattern of the high-impurity-concentration region 30, is formed on the surface 18. Conductivity modifiers, N type in this example, are then deposited and diffused into the low-impurity-concentration region 32 to produce the high-impurity-concentration region 30, as shown in FIG. 6. Such a "double-diffusion" process inherently results in a distinct point of inflection in the impurity-concentration profile which defines the exact location of the high-low junction; FIG. 10a shows that the high-low junction therein is disposed at a depth of about 1.5 micrometers. During the diffusion process, the opening 80 is closed with an oxide coating 82. The more-heavily-doped collector contact region 44 may be formed simultaneously with the high-impurity-concentration region 32 in a similar manner.

From this point on, the method is entirely conventional. The protective layer 36 of insulating material is formed on the surface 18 of the transistor 10 with appropriate openings therein through which to contact the collector, base and emitter regions 12, 14 and 16. Next the collector, base and emitter contact electrodes 38, 40 and 42 are formed using conventional processes to complete the production of the bipolar transistor 10 illustrated in FIGS. 7 and/or 8, the difference being in the shape or size of the region 34.

The present novel method is readily compatible with conventional bipolar processing and may be used to integrate the present novel transistor 10 into a monolithic integrated circuit device 84 which has the novel transistor 10 as an element thereof, as shown in FIG. 9. The integrated circuit device 84, in addition to the novel transistor 10 which comprises a first transistor thereof, may further include a conventionally-formed second vertical planar transistor 86 having the collector, the base and the emitter regions 88, 90 and 92 thereof adjacent to the common surface 18. The collector region 88 of the second transistor comprises an additional junction-isolated region disposed in the body 20 of semiconductor material. The second transistor 86 has collector, base and emitter electrodes 94, 96, and 98, and may also have a more-heavily-doped collector contact region 100.

The method of forming the device 84 may utilize steps similar to those described above to produce corresponding regions simultaneously. In particular, the steps of forming the base region 14 of the second transistor 86 and the higher-impurity-concentration portion 34 of the base region 14 of the first transistor 10 may be performed simultaneously, and the steps of forming the emitter region 92 of the second transistor 86 and the high-impurity-concentration portion 30 of the emitter region 16 of the first transistor may be performed simultaneously. Also, the collector contact regions 44 and 100 may be formed simultaneously with the formation of the high-impurity-concentration portion 30 of the emitter region 16 of the first transistor. The aforementioned regions which are formed simultaneously will have substantially identical impurity-concentration profiles. The use of the word substantially means that, even though the diffusion times and sources of conductivity modifiers used to form these regions are identical, the impurity-concentration profiles will be affected slightly by a differing background dopant concentration of the areas into which these regions are formed. FIGS. 10a through 10e illustrate typical impurity-concentration profiles taken respectively at locations where regions 30, 34, 92, 90 and 100 make contact to the metal electrodes.

The high-low emitter structure of the novel transistor 10 results in improved performance, especially in achieving a high current gain ($\beta$) even at low collector currents. In operation, the high-impurity-concentration portion 30 of the emitter region 16 provides the source of electrons required for high current gain, while the low-impurity-concentration portion 32 of the emitter region 16 creates a built-in electric field at the high-low junction which operates as an electrical barrier to reflect the minority carriers from the base region away from the junction. The value of the injected minority current from the base region is thereby kept low, resulting in high emitter efficiency and consequently high current gain. The use of this high-low structure in combination with a graded impurity-concentration portion 32, wherein the lowest-impurity-concentration section thereof is disposed adjacent the base region 14, further improves the emitter efficiency by creating a stronger electrical barrier to reflect the minority carriers. The graded impurity concentration creates a drift field in the low-impurity-concentration portion 32 which, in cooperation with the electric field at the high-low junction, further enhances this electrical barrier, thus allowing an even higher emitter efficiency to be obtained. Of course, the present novel high-low transistor 10 retains all the advantages inherent in the above-mentioned Schlegel and Sony structures, such as, for example, higher yields and increased emitter-base breakdown voltage. In addition, the width of the base 14 may be accurately defined independently of the formation of the high-impurity-concentration portion 30 of the emitter region, which provides for improved control over current gain and uniformity of current injection.

The higher-impurity-concentration portion 34 of the base region 14 prevents the active portion of the base region 14, i.e., the remaining lower-impurity portion, from terminating at the surface 18 of the transistor 10. Consequently, this lower-impurity portion of the base region 14 is not affected by variable surface conditions which may contribute to undesirable leakage currents. Where integrated circuit devices utilize a relatively low emitter-base breakdown voltage in operation, the higher-impurity-concentration portion 34 of the base region 14 may be extended to meet the high-impurity-concentration portion 30 of the emitter region 16, as illustrated in FIG. 8, thereby maintaining the relatively lower breakdown voltage. Although the embodiments illustrated in the drawings comprise NPN transistors, the present invention is applicable to PNP transistors as well as NPN transistors.

What is claimed is:

1. In a semiconductor device having a collector region of one type conductivity, a base region of the opposite type conductivity disposed adjacent said collector region, and an emitter region disposed adjacent said base region away from said collector region and of said one type conductivity, said emitter region having a depth greater than about 0.5 micrometers and having a relatively high-impurity-concentration portion separated from said base region by a significantly lower-impurity-concentration portion disposed therebetween, said portions of said emitter region being separated from each other by a high-low junction characterized by a point of inflection in the profile of the logarithm of the impurity-concentration vs. depth, the emitter doping concentration at said point of inflection being less than $2 \times 10^{18}$ atoms per cubic centimeter, said high-low junction being sufficient in depth to be effective, during operation of said device, as a barrier to reflect minority carriers from said base region, the improvement comprising:

said low-impurity-concentration portion having a graded impurity concentration therein with the lowest-impurity-concentration section thereof being disposed adjacent said base region.

2. A semiconductor device as defined in claim 1 wherein said collector, said base and said emitter regions comprise a planar bipolar transistor having said collector, said base and said emitter regions adjacent to a common surface thereof.

3. A semiconductor device as defined in claim 2 wherein said low-impurity-concentration portion of said emitter region is graded in one direction only with the highest-impurity-concentration section thereof disposed adjacent said common surface.

4. A semiconductor device as defined in claim 2 wherein said transistor is a vertical transistor and wherein that portion of said base region disposed adjacent said common surface and between said collector and said emitter regions has an impurity concentration higher than the remaining portion of said base region.

5. A semiconductor device as defined in claim 4 wherein said higher-impurity-concentration portion of said base region extends through that portion of said emitter region adjacent thereto so that it meets said high-impurity-concentration portion of said emitter region, whereby said low-impurity-concentration portion of said emitter region is not adjacent to said common surface.

6. A semiconductor device as defined in claim 4 wherein said device is a monolithic integrated circuit device including a body of semiconductor material of said opposite type conductivity and wherein the collector region of said transistor is a junction-isolated region disposed in said body of semiconductor material.

7. A semiconductor device as defined in claim 6 wherein said transistor comprises a first transistor thereof and wherein said monolithic integrated circuit device further includes a second vertical planar transistor having the collector, the base and the emitter regions thereof adjacent to said common surface, the collector region of said second transistor being an additional junction-isolated region disposed in said body of semiconductor material, wherein said higher-impurity-concentration portion of the base region of said first transistor and the base region of said second transistor have substantially identical impurity-concentration profiles and wherein said high-impurity-concentration portion of the emitter region of said first transistor and the emitter region of said second transistor have substantially identical impurity-concentration profiles.

8. A semiconductor device as defined in claim 7 wherein said first and said second transistors have collector contact regions of said one type conductivity adjacent to said common surface and of higher impurity concentration than the collector regions in which said collector contact regions are respectively disposed, and wherein the collector contact regions of said first and said second transistors have impurity-concentration profiles substantially identical to the impurity-concentration profile of said high-impurity-concentration portion of the emitter region of said first transistor.

* * * * *